United States Patent
Jiang

(10) Patent No.: US 11,165,040 B2
(45) Date of Patent: Nov. 2, 2021

(54) PACKAGE STRUCTURE, PACKAGING METHOD AND DISPLAY DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventor: Zhiliang Jiang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 342 days.

(21) Appl. No.: 16/097,665

(22) PCT Filed: Feb. 6, 2018

(86) PCT No.: PCT/CN2018/075470
§ 371 (c)(1),
(2) Date: Oct. 30, 2018

(87) PCT Pub. No.: WO2019/015303
PCT Pub. Date: Jan. 24, 2019

(65) Prior Publication Data
US 2020/0259114 A1 Aug. 13, 2020

(30) Foreign Application Priority Data
Jul. 21, 2017 (CN) .......................... 201710605623.5

(51) Int. Cl.
*H01L 51/52* (2006.01)
*H01L 51/00* (2006.01)
*H01L 51/56* (2006.01)

(52) U.S. Cl.
CPC ...... *H01L 51/5246* (2013.01); *H01L 51/0024* (2013.01); *H01L 51/525* (2013.01); *H01L 51/56* (2013.01)

(58) Field of Classification Search
CPC .................................................. H01L 51/5246
See application file for complete search history.

(56) References Cited

U.S. PATENT DOCUMENTS

2010/0090587 A1* 4/2010 Tsujimura ........... H01L 51/5246
313/504
2011/0127548 A1* 6/2011 Lee ..................... H01L 51/5246
257/88
(Continued)

FOREIGN PATENT DOCUMENTS

| CN | 203850302 U | 9/2014 |
| CN | 104882556 A | 9/2015 |

(Continued)

OTHER PUBLICATIONS

First Office Action for CN Appl. No. 201710605623.5, dated Aug. 6, 2018.
(Continued)

*Primary Examiner* — Charles D Garber
(74) *Attorney, Agent, or Firm* — Dinsmore & Shohl LLP

(57) ABSTRACT

The present disclosure relates to package structure, packaging method and display device. A package structure comprises: a first substrate and a second substrate disposed opposite to each other, a peripheral portion of at least one of the first substrate and the second substrate being provided with a sealing hole; a first sealing structure disposed between the first substrate and the second substrate and located at a peripheral region of the first substrate; and a
(Continued)

second sealing structure disposed in the sealing hole, wherein the first sealing structure is bonded to the second sealing structure.

16 Claims, 5 Drawing Sheets

(56) References Cited

U.S. PATENT DOCUMENTS

| | | | |
|---|---|---|---|
| 2012/0235170 A1 | 9/2012 | Lee | |
| 2014/0332774 A1* | 11/2014 | Wu | H01L 51/56 257/40 |
| 2015/0194627 A1* | 7/2015 | Liu | C03C 27/10 428/76 |
| 2017/0133626 A1* | 5/2017 | Senoo | H01L 51/5203 |

FOREIGN PATENT DOCUMENTS

| | | |
|---|---|---|
| CN | 105161512 A | 12/2015 |
| CN | 106299154 A | 1/2017 |
| CN | 106489301 A | 3/2017 |
| CN | 107403871 A | 11/2017 |

OTHER PUBLICATIONS

International Search Report and Written Opinion for International Appl. No. PCT/CN2018/075470, dated May 16, 2018.
Second Office Action for CN Appl. No. 20171060523.5, dated Mar. 19, 2019.

* cited by examiner

PACKAGE STRUCTURE, PACKAGING METHOD AND DISPLAY DEVICE

CROSS-REFERENCE TO RELATED APPLICATIONS

The present application is a U.S. National Stage Application under 35 U.S.C. § 371, of International Patent Application No. PCT/CN2018/075470, filed on Feb. 6, 2018, which claims priority to Chinese Application No. 201710605623.5, filed on Jul. 21, 2017, each of which is incorporated herein by reference in its entirety.

TECHNICAL FIELD

The present disclosure relates to the field of display device packaging, and in particular, to a package structure, a packaging method, and a display device.

BACKGROUND

Organic Light-Emitting Diode (OLED) display device is an emerging flat panel display device with full solid-state structure, high brightness, full viewing angle, fast response and flexible display, and thus is widely used in the display industry. The main display device of the OLED display is the OLED device, and the OLED device may be easily corroded by oxygen, water and the like in the air, which may seriously affect the service life of the OLED device. Therefore, it is generally required to package the OLED device by using a package structure to make the OLED device isolated from oxygen, water and other components in the air, so as to extend the life of the OLED device.

In the related art, the package structure includes: a base substrate and a package cover disposed opposite to each other, and a support post and a sealing structure disposed between the base substrate and the package cover. The base substrate, the package cover and the sealing structure form a seal cavity in which the OLED device is located. The sealing structure comprises a sealing structure formed from a frit glue applied between the base substrate and the package cover plate, and a sealing structure formed from an ultraviolet (UV) glue applied between the base substrate and the package cover plate, the UV glue being applied around the Frit glue.

SUMMARY

The present disclosure provides a package structure, a packaging method, and a display device.

In a first aspect, a package structure is provided that comprises: a first substrate and a second substrate disposed opposite to each other, and a first sealing structure disposed between the first substrate and the second substrate and located at a peripheral portion of the first substrate, a peripheral region of at least one of the first substrate and the second substrate being provided with a sealing hole, and the sealing hole being provided with a second sealing structure, the first sealing structure being bonded to the second sealing structure.

Optionally, the peripheral region of the first substrate and the peripheral region of the second substrate are both provided with uniformly arranged sealing holes.

Optionally, the sealing holes on the first substrate are in one-to-one correspondence with the sealing holes on the second substrate, and there is an overlapping region of the orthographic projections of two one-to-one corresponding sealing holes on the plane of the first substrate.

Optionally, all of the sealing holes have the same structure, and a shape of a longitudinal axis section of any one of the sealing holes passing through a central axis thereof is a rectangle or a trapezoid, and a shape of a lateral axis section perpendicular to the longitudinal axis section is a rectangular shape, a circular shape, or a triangular shape. The central axes of the one of two sealing holes, which are in the one-to-one correspondence, out of the sealing holes of the first substrate and the second substrate are collinear.

Optionally, the sealing hole is a circular hole, and the diameter of the sealing hole ranges from 0.5 mm to 2 mm.

Optionally, the package structure further comprises: a third sealing structure disposed between the first substrate and the second substrate and located at a peripheral region of the first substrate, the first sealing structure being located around the third sealing structure.

Optionally, the package structure further comprises: a support pillar disposed between the first substrate and the second substrate, wherein the first substrate, the second substrate, the support pillar, and the first sealing structure form a sealed cavity for encapsulating the device to be packaged.

Optionally, the forming material of the first sealing structure comprises an ultraviolet (UV) glue, and the forming material of the third sealing structure comprises a frit glue, and the elasticity of the UV glue is greater than the elasticity of the frit glue.

In a second aspect, a method of packaging is provided, the method comprising:

providing a first substrate and a second substrate;

disposing the first substrate and the second substrate opposite to each other, a device to be packaged and a first sealing structure being formed between the first substrate and the second substrate, the first sealing structure being located at a peripheral region of the first substrate, a peripheral region of at least one of the first substrate and the second substrate being formed with a sealing hole, a second sealing structure being formed in the sealing hole, and the first sealing structure being bonded to the second sealing structure.

Optionally, said disposing the first substrate and the second substrate opposite to each other, a device to be packaged and a first sealing structure being formed between the first substrate and the second substrate, the first sealing structure being located at a peripheral region of the first substrate, a peripheral region of at least one of the first substrate and the second substrate being formed with a sealing hole, a second sealing structure being formed in the sealing hole, and the first sealing structure being bonded to the second sealing structure comprises:

disposing the first substrate and the second substrate opposite to each so that a device to be packaged is provided between the first substrate and the second substrate;

forming a sealing hole in a peripheral region of at least one of the first substrate and the second substrate;

applying a first sealant between the first substrate and the second substrate, the first sealant being capable of entering the sealing hole under action of capillary force;

curing the first sealant to form a first sealing structure between the first substrate and the second substrate, and a second sealing structure in the sealing hole, the first sealing structure being bonded to the second sealing structure.

Optionally, the forming a sealing hole in a peripheral region of the at least one of the first substrate and the second substrate comprises: forming uniformly distributed sealing holes in a peripheral region of the first substrate and a peripheral region of the second substrate, respectively.

Optionally, the forming a sealing hole in a peripheral region of the at least one of the first substrate and the second substrate comprises:

forming sealing holes in a peripheral region of at least one of the first substrate and the second substrate by a laser puncher.

Optionally, disposing the first substrate and the second substrate opposite to each other so that the device to be packaged is provided between the first substrate and the second substrate comprises:

forming a support pillar on at least one of the first substrate and the second substrate;

applying a second sealant at a peripheral region of at least one of the first substrate and the second substrate;

disposing the first substrate and the second substrate opposite to each other such that the device to be packaged and the support pillar are located between the first substrate and the second substrate;

curing the second sealant to form a third sealing structure between the first substrate and the second substrate;

performing a curing process on the first sealant to form a first sealing structure between the first substrate and the second substrate, and a second sealing structure in the sealing hole, the first sealing structure being bonded to the second sealing structure, including:

performing a curing process on the first sealant to form the first sealing structure between the first substrate and the second substrate, and a second sealing structure in the sealing hole, the first sealing structure being bonded to the second sealing structure, the first sealing structure being located around the third sealing structure.

Optionally, the forming material of the first sealing structure comprises UV glue, and the forming material of the third sealing structure comprises frit glue, and the elasticity of the UV glue is greater than the elasticity of the glass frit glue.

In a third aspect, a display device is provided that comprises an organic light emitting diode (OLED) device, and the package structure according to any implementations of the first.

According to an aspect of the present disclosure, there is provided a package structure comprising: a first substrate and a second substrate disposed opposite to each other, a peripheral portion of at least one of the first substrate and the second substrate being provided with a sealing hole; a first sealing structure disposed between the first substrate and the second substrate and located at a peripheral region of the first substrate; and a second sealing structure disposed in the sealing hole, wherein the first sealing structure is bonded to the second sealing structure.

In some embodiments, the peripheral region of the first substrate and a peripheral region of the second substrate are each provided with sealing holes which are uniformly arranged.

In some embodiments, the sealing holes on the first substrate correspond to the sealing holes on the second substrate in a one-to-one manner, and the orthographic projections of the sealing holes of the first substrate and the sealing holes of the second substrate, which correspond to each other, on a plane where the first substrate is located have overlap regions.

In some embodiments, any one of the sealing holes has a longitudinal cross-section of a rectangular or trapezoidal shape along a central axis thereof, and has a lateral cross-section of a rectangular, circular or triangular shape, the lateral cross-section being perpendicular to the longitudinal cross-section, and the central axes of the sealing holes of the first substrate and the central axes of the corresponding sealing holes of the second substrate are substantially collinear.

In some embodiments, the sealing hole is a circular hole, and a diameter of the sealing hole is in a range from 0.5 mm to 2 mm.

In some embodiments, the package structure further comprises: a third sealing structure disposed between the first substrate and the second substrate and located at the peripheral region of the first substrate, the first sealing structure being located around the third sealing structure, wherein the first substrate, the second substrate, and the third sealing structure form a sealed cavity for encapsulating therein a device to be packaged.

In some embodiments, the package structure further comprises: a support pillar disposed between the first substrate and the second substrate, wherein the first substrate, the second substrate, the support pillar and the first sealing structure form a sealed cavity for encapsulating therein a device to be packaged.

In some embodiments, forming material of the first sealing structure comprises ultraviolet (UV) glue, and forming material of the third sealing structure comprises frit glue, wherein an elasticity of the UV glue is set to be greater than that of the frit glue.

According to another aspect of the present disclosure, there is provided a packaging method comprising: providing a first substrate and a second substrate, wherein a peripheral region of at least one of the first substrate and the second substrate is provided with a sealing hole; disposing the first substrate and the second substrate opposite to each other, and disposing between the first substrate and the second substrate a device to be packaged; and forming a first sealing structure between the first substrate and the second substrate, and forming a second sealing structure in the sealing hole, wherein the first sealing structure is located at a peripheral region of the first substrate and is disposed around the device to be packaged, and wherein the first sealing structure is bonded to the second sealing structure.

According to a further aspect of the present disclosure, there is provided a packaging method comprising: providing a first substrate and a second substrate; disposing the first substrate and the second substrate opposite to each other, and disposing between the first substrate and the second substrate a device to be packaged; forming a sealing hole in a peripheral region of at least one of the first substrate and the second substrate; and forming a first sealing structure between the first substrate and the second substrate, and forming a second sealing structure in the sealing hole, wherein the first sealing structure is located at a peripheral region of the first substrate and is disposed around the device to be packaged, and wherein the first sealing structure is bonded to the second sealing structure.

In some embodiments, forming a first sealing structure between the first substrate and the second substrate and forming a second sealing structure in the sealing hole comprises: applying a first sealant between the first substrate and the second substrate so that the first sealant enters the sealing hole under an action of capillary force; and curing the first sealant to form the first sealing structure between the first substrate and the second substrate, and the second sealing structure in the sealing hole.

In some embodiments, the sealing holes are formed to be uniformly arranged in the peripheral region of the first substrate and a peripheral region of the second substrate.

In some embodiments, the sealing hole is formed in the peripheral region of at least one of the first substrate and the second substrate by using a laser puncher.

In some embodiments, the method further comprises: applying a second sealant at the peripheral region of at least one of the first substrate and the second substrate; wherein the first substrate and the second substrate are disposed opposite to each other such that the second sealant and the device to be packaged are disposed between the first substrate and the second substrate; and curing the second sealant to form a third sealing structure between the first substrate and the second substrate, wherein the first sealing structure is located around the third sealing structure.

In some embodiments, the method further comprises: forming a support pillar on at least one of the first substrate and the second substrate, wherein the first substrate and the second substrate are disposed opposite to each other such that the support pillar is between the first substrate and the second substrate.

In some embodiments, forming material of the first sealing structure comprises ultraviolet (UV) glue, and forming material of the third sealing structure comprises frit glue, wherein an elasticity of the UV glue is set to be greater than that of the frit glue.

According to a still further aspect of the present disclosure, there is provided a display device comprising: a package structure according to any aspects or embodiments described above or below; and an organic light emitting diode (OLED) device sealed in the package structure.

It should be noted that the above general descriptions and the following detailed descriptions are merely illustrative and not restrictive.

BRIEF DESCRIPTION OF DRAWINGS

In order to more clearly illustrate the technical solutions of the embodiments of the present disclosure, the drawings used in the descriptions of the embodiments will be briefly described below. It is obvious that the drawings described are only some embodiments of the present disclosure. Those with ordinary skills in the art may readily obtain other figures or embodiments from the drawings or embodiments of the present disclosure without inventive steps.

The accompanying drawings, which are incorporated in and constitute a part of the specification, illustrates the embodiments of the present disclosure, and are used together with the specification to explain the principles of the present disclosure.

DETAILED DESCRIPTIONS OF ILLUSTRATIVE EMBODIMENTS

For making the purposes, technical solutions and advantages of present disclosure more clear, the present disclosure will be further described in detail with reference to the accompanying drawings. Obviously, the embodiments described therein are merely a part of the possible embodiments, and are not used to enumerate all the possible embodiments. All other embodiments that can be obtained by a person of ordinary skill in the art based on the embodiments of the present disclosure without inventive efforts are intended to be embraced by the present disclosure.

As an emerging flat panel display device, OLED device has attracted wide attention. However, components such as water vapor and oxygen in the air may easily enter the OLED device, which may corrode the electrode layer and the organic light-emitting layer in the OLED device, deteriorate the performance of the OLED device, and seriously affect the service life of the OLED. If the OLED device is sealed in a vapor-free and oxygen-free environment, the lifetime of the OLED device can be significantly extended. Usually, the OLED device can be packaged with a package structure to seal the OLED device in a vapor-free and oxygen-free environment. Therefore, the packaging technology for the OLED device becomes a key technology for improving the service life of the OLED device. The conventional package structure may be a cover package structure to protect the OLED device from outside atmosphere.

Figure 1A:
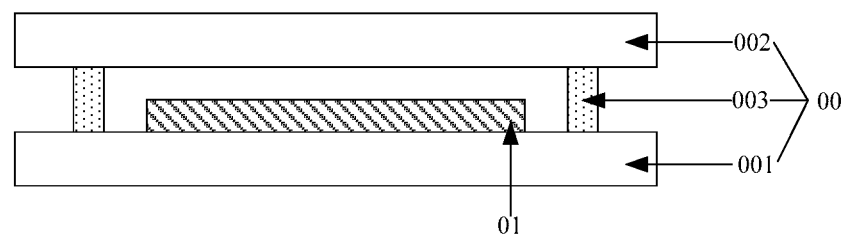
FIG. 1A is a schematic diagram of a package structure according to the related art.

Referring to FIG. 1A, a schematic diagram of a package structure 00 according to the related art is illustrated, and it can be a cover package structure. Referring to FIG. 1A, the package structure 00 comprises: a base substrate 001 and a package cover 002 which are oppositely disposed, and a sealing structure 003 disposed between the base substrate 001 and the package cover plate 002. The OLED device 01 is disposed on the base substrate 001 and is located in a sealed cavity formed by the substrate 001, the package cover plate 002, and the sealing structure 003. The sealing structure 003 is typically formed using a UV glue or a Frit glue. When the sealing structure 003 is formed from Frit glue, the package structure 00 shown in FIG. 1A may also be referred to as a glass package structure.

Figure 1B:
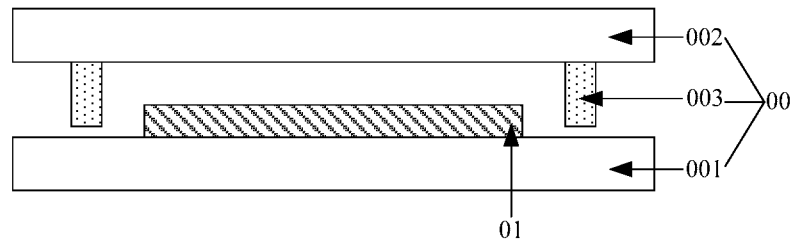
FIG. 1B is a schematic view showing that the sealing structure of the package structure shown in FIG. 1A is separated from the substrate.
Figure 1C:
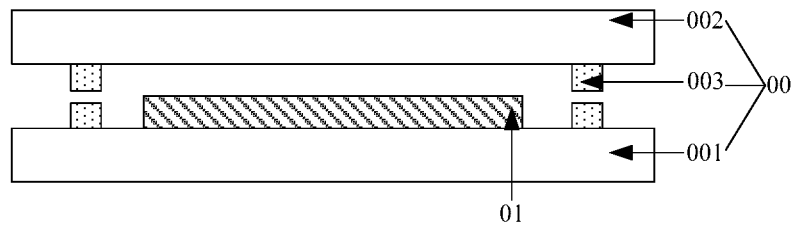
FIG. 1C is a schematic view showing that the sealing structure of the package structure shown in FIG. 1A is broken.
Figure 1D:
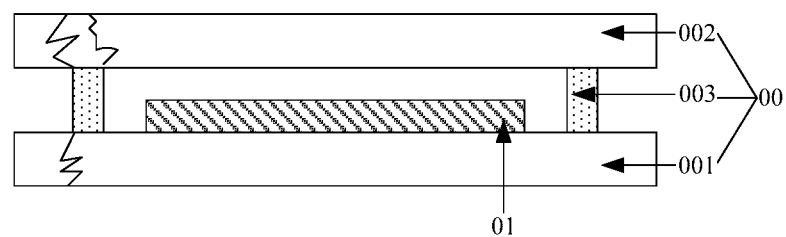
FIG. 1D is a schematic view showing that the substrate and the package cover plate of the package structure shown in FIG. 1A is broken.

Generally, after packaging an OLED device with a package structure, a tensile strength test is required for the package structure. In the case that the sealing structure 003 is formed from Frit glue, when the tensile strength test is performed on the package structure 00, usually one or more of the following cases may occur: the sealing structure 003 may be separated from the base substrate 001 and/or the package cover 002, the sealing structure 003 may be broken, the base substrate 001 and/or the package cover 002 is broken, and the like. Therefore, the package structure shown in FIG. 1A may have a low mechanical strength. FIG. 1B shows the case where the sealing structure 003 is separated from the base substrate 001. FIG. 1C shows the case that the sealing structure 003 is broken. FIG. 1D shows the case where the base substrate 001 and the package cover 002 are broken.

In order to enhance the mechanical strength of the package structure 00, the related art proposes another package structure. On the basis of the package structure 00 shown in FIG. 1A, a sealing structure formed from a UV glue and disposed outside the sealing structure 003 is added. Since the elasticity of the UV glue is usually large, the mechanical strength of the package structure can be enhanced to some extent. However, when the tensile strength test is performed on such a package structure, the mechanical strength of the package structure is still low, and there may still be the cases that the sealing structure is separated from the base substrate 001 and/or the package cover, the sealing structure is broken, and the base substrate and/or the package cover is broken.

For addressing the problem(s), the present invention is proposed. According to the package structure, the packaging method, and the display device of the embodiments of the present disclosure, the mechanical strength of the package structure can be effectively enhanced. The package structure, the packaging method, and the display device according to the embodiments of the present disclosure will be described below in details.

Figure 2:
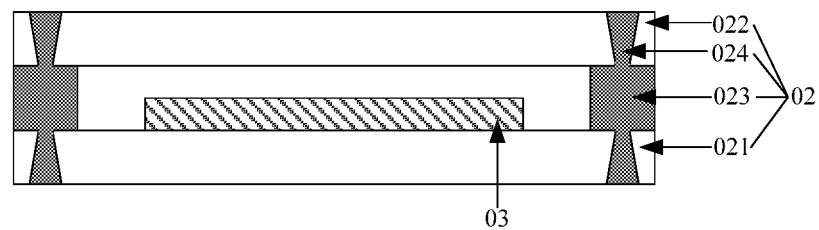
FIG. 2 is a schematic diagram of a package structure according to an embodiment of the present disclosure.

Referring to FIG. 2, a schematic diagram of a package structure 02 according to some embodiments of the present disclosure is illustrated. Referring to FIG. 2, the package structure 02 comprises: a first substrate 021 and a second substrate 022 disposed opposite to each other, and The a first sealing structure 023 disposed between the first substrate 021 and the second substrate 022 and located at a peripheral region or peripheral regions (not shown in FIG. 2) of the first substrate 021 and/or the second substrate 022. The peripheral region of at least one of the first substrate 021 and the second substrate 022 is provided with sealing hole(s) (not shown in FIG. 2, and can be best seen from FIG. 7C). A second sealing structure 024 is disposed in the sealing hole. The first sealing structure 023 is bonded to the second sealing structure 024. The device to be packaged 03 may be disposed on the first substrate 021; and it is apparent that the present disclosure shall not be limited thereto. The device 03 is disposed within a sealed cavity surrounded by the first substrate 021, the second substrate 022, and the first sealing structure 023.

In some embodiments of the present disclosure, generally, the device to be packaged 03 may be disposed away from the edge of the sealed cavity by a predetermined distance, such as at the center of the cavity, to facilitate the formation of the sealing structure surrounding the device 30. Correspondingly, the orthographic projection of the device to be packaged 03 (or the region on which the device be mounted) on the first substrate or the second substrate (or the "footprint" thereof) may also be set to be away from the edge of the corresponding substrate by a predetermined distance. The sealing hole (and the sealing structure, etc.) may be disposed in a peripheral region between the orthographic projection of the device to be packaged 03 (or the region on which the device is to be mounted) on the first substrate or the second substrate and the edge of the corresponding substrate (as indicated by 401 in FIG. 4).

In some embodiments, as shown in FIG. 2, the size (lateral dimension) of the first sealing structure 023 is larger than the size of the sealing hole.

According to an embodiment of the present disclosure, there is provided a package structure comprising: a first substrate and a second substrate disposed oppositely, a peripheral portion of at least one of the first substrate and the second substrate being provided with a sealing hole; a first sealing structure disposed between the first substrate and the second substrate and located at a peripheral region of the first substrate; and a second sealing structure disposed in the sealing hole, wherein the first sealing structure is bonded to the second sealing structure. Since the first sealing structure is bonded to the second sealing structure, the mechanical strength of the package structure can be enhanced. In addition, since the first sealing structure is bonded to the second sealing structure in the sealing hole, the influence of transverse shear stress can be reduced, thereby it is advantageous for reducing the probability of the substrate being broken as shown in FIG. 1D.

Figure 3:
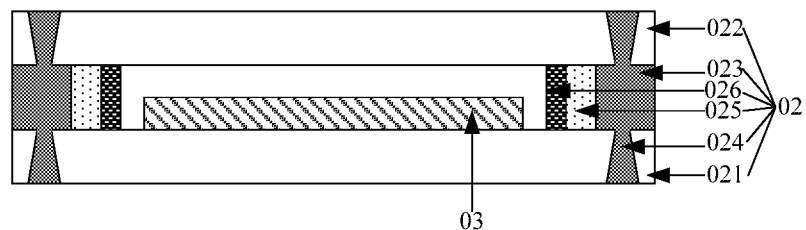
FIG. 3 is a schematic diagram of a package structure according to another embodiment of the present disclosure.

Optionally, the peripheral region of the first substrate 021 and the peripheral region of the second substrate 022 are both provided with sealing holes which are uniformly arranged. For example, in some embodiments, the sealing holes on the substrate can be arranged to be separated from each other by an equal distance. In an exemplary embodiment, as shown in the figures, the sealing holes on the substrate may be arranged to be equidistantly arranged around the mounting region of the device to be packaged. In some embodiments, the sealing holes on the first substrate 021 and the sealing holes on the second substrate 022 may correspond to each other in an one-to-one manner. There is an overlapping region of the orthographic projections of two corresponding sealing holes (a sealing hole on the first substrate 021 and a sealing holes on the second substrate 022) on the plane where the first substrate 021 is located. Since the second sealing structure is disposed in the sealing hole, as shown in FIG. 3, the second sealing structure 024 disposed in the sealing hole of the first substrate 021 and the second sealing structure 024 disposed in the sealing hole of the second substrate 022 can be in a one-to-one correspondence. The orthographic projection of the second sealing structure 024 which is disposed in the sealing hole of the first substrate 021 on the plane of the first substrate 021 can have an overlapping region with the second sealing structure 024 disposed in the sealing hole of the second substrate 022.

Alternatively, the structures of all the sealing holes may be identical to each other. The axes of any sealing hole may include a longitudinal axis (including a central axis) along the direction of extension (or length) of the sealing hole and a lateral axis that is perpendicular to the longitudinal axis. In some embodiments, the longitudinal axis of any of the sealing holes can be set to be perpendicular to the face of the substrate on which the sealing hole is located (or the plane in which the substrate is located). In some embodiments, the lateral axis of any of the sealing holes can be set to be parallel to the face of the substrate on which the sealing hole is located. For example, the longitudinal axes of the sealing holes on the first substrate 021 can be perpendicular to the face of the first substrate 021, and the lateral axis of the sealing holes on the first substrate 021 may be parallel to the face of the first substrate 021. In some embodiments, the shape of the longitudinal section of any of the sealing holes passing through its central axis may be rectangular or trapezoidal. In some embodiments, the shape of the lateral section of the sealing hole, which is perpendicular to the longitudinal axis section, may be rectangular, circular or triangular. In some embodiments, two corresponding sealing holes out of the sealing holes of the first substrate 021 and the second substrate 022 may be set to be collinear with their central axes.

The longitudinal section of the sealing hole is parallel to the longitudinal axis of the sealing hole, and the lateral section of the sealing hole being perpendicular to the longitudinal axis of the sealing hole. In some exemplary embodiments of the present disclosure, as shown in FIG. 2, the longitudinal section of the sealing hole may be trapezoidal. In addition, the sealing holes on the first substrate 021 and the sealing holes on the second substrate 022 may correspond to each other in an one-to-one manner, as shown in FIG. 2. Furthermore, the longitudinal axes (not shown) of two sealing holes corresponding to each other may be arranged to be substantially collinear.

In some embodiments of the present disclosure, the sealing hole may be a circular hole. The aperture of the sealing hole may have a value ranging, for example, from 0.5 mm to 2 mm. In some embodiments, the sealing hole is a through hole.

Further, referring to FIG. 3, a schematic structural diagram of a package structure 02 according to some other embodiments of the present disclosure is illustrated. Here, on the basis of FIG. 2, the portions of the package structure shown in FIG. 3 which are different from the package structure shown in FIG. 2 will be mainly described. The components of the package structure shown in FIG. 3 which are the same as those of the package structure shown in FIG. 2 are denoted by the same reference numerals, and repeated descriptions thereof are thus omitted here.

Referring to FIG. 3, the package structure 02 further comprises on the basis of FIG. 2: a third sealing structure 025 disposed between the first substrate 021 and the second substrate 022 and located at the peripheral region of the first substrate 021. The first sealing structure 023 can be located around the third sealing structure 025. In some embodiments, the first sealing structure 023 can be located at the outer side of the third sealing structure 025. Additionally, in some embodiments, the third sealing structure 025 can be in contact with the first sealing structure 023.

With reference to FIG. 3, in some embodiments, the package structure 02 may further include: support post(s) 026 disposed between the first substrate 021 and the second substrate 022. In some embodiments, the first substrate 021, the second substrate 022, the support post(s) 026, and the first sealing structure 023 collectively form a sealed cavity for encapsulating the device to be packaged 03. It is apparent that the present disclosure is not limited thereto, and in some embodiments, the first substrate 021, the second substrate 022, and the first sealing structure 023 may collectively form a sealed cavity for encapsulating the device to be packaged 03, as shown in FIG. 2. It should be noted that, in practical applications, the sealing structure (the first sealing structure 023 and/or the third sealing structure 025) is formed by curing the sealing glue, and the supporting pillar 026 can support between the first substrate 021 and the second substrate 022 to prevent pressure from being applied by the second substrate 022 to the device to be packaged 03 to damage the device before the sealant is cured. In some embodiments, the device to be packaged 03 can be an OLED device.

According to these embodiments, the mechanical strength of the package structure can be further enhanced and a better sealing can be provided.

Figure 4:
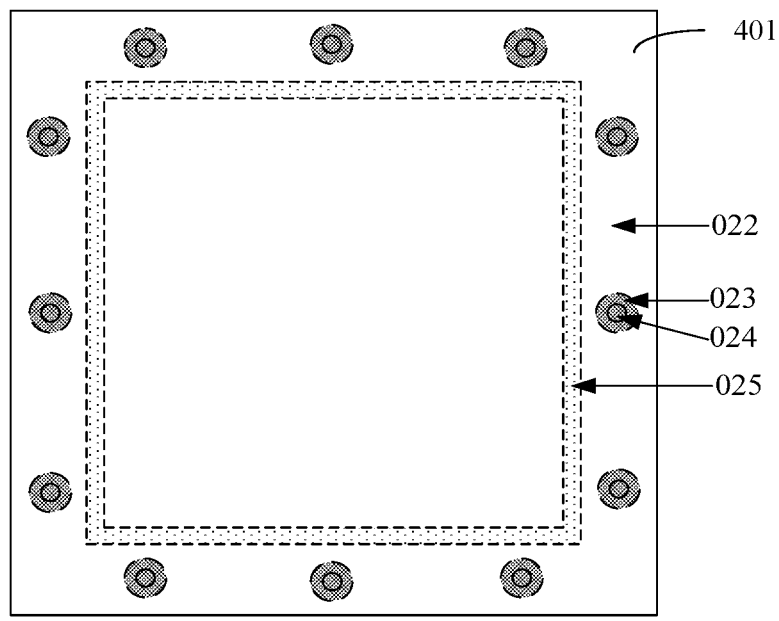
FIG. 4 is a top plan view of a package structure according to an embodiment of the present disclosure.

FIG. 4 is a top plan view of a package structure according to an embodiment of the present disclosure. Referring to FIG. 4, a first sealing structure 023 and a third sealing structure 025 are disposed between the first substrate (not shown in FIG. 4) and the second substrate 022. In the embodiment shown in FIG. 4, the first sealing structure 023 can be located outside the third sealing structure 025. The peripheral region of the first substrate and the peripheral region of the second substrate 022 can be provided with uniformly arranged sealing holes (not shown in FIG. 4). In this embodiment, the sealing holes are shown as circular holes. Second sealing structures 024 are formed in the sealing holes. The second sealing structures disposed in the sealing holes of the first substrate and the second sealing structures 024 disposed in the sealing holes of the second substrate 022 may be disposed in a one-to-one correspondence manner. The orthographic projections of the second sealing structure 024 disposed in the sealing holes of the first substrate on the plane of the first substrate 021 and the orthographic projections of the second sealing structures 024 disposed in the sealing holes of the second substrate 022 on the plane of the first substrate 021 can have overlapping regions. It should be noted that, in FIG. 4, the structure indicated by the broken line is located below the second substrate 022, and the support pillar is not shown in FIG. 4.

Optionally, the forming material of the first sealing structure 023 comprises UV glue. Optionally, the forming material of the third sealing structure 025 comprises frit glue. The elasticity of the UV glue can be set to be greater than the elasticity of the glass frit. The forming material of the second sealing structure 024 may be the same as the forming material of the first sealing structure 023. According to some embodiments of the present disclosure, the first sealing structure 023 and the second sealing structure 024 are formed by using UV glue, the toughness and the bonding force of the first sealing structure 021 and the second sealing structure 024 can be improved, thereby enhancing the mechanical strength of the package structure 02.

It should be understood that the package structure according to the present embodiment can further enhance the mechanical strength of the package structure.

Packaging methods according to embodiments of the present disclosure will be described below with reference to the accompanying drawings. The packaging methods described hereinafter and above may be combined with the package structures according to the embodiments of the present disclosure as appropriate.

Figure 5:
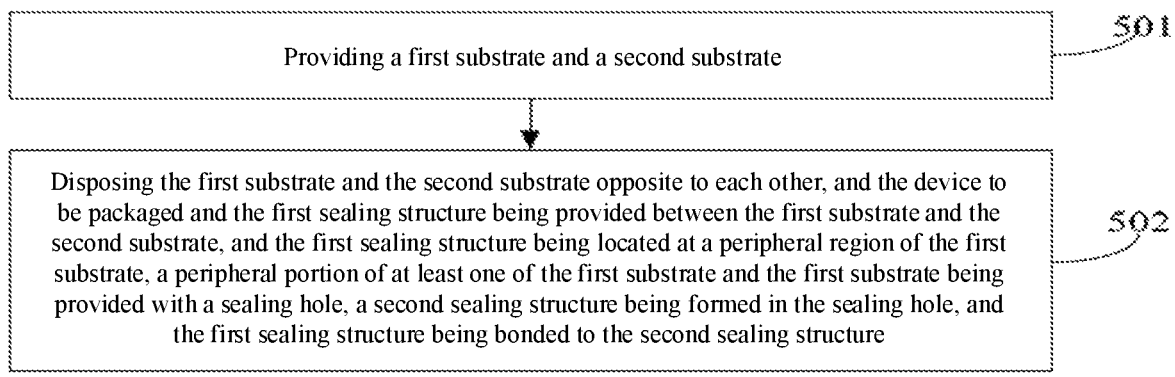
FIG. 5 is a flowchart of a packaging method according to an embodiment of the present disclosure.

Referring to FIG. 5, a method flow diagram of a packaging method according to an embodiment of the present disclosure is illustrated. The packaging method can be used to form the package structure shown in FIG. 2 or FIG. 3 to package the device to be packaged. In some embodiments, the device to be packaged can be an OLED device. Referring to FIG. 5, the method comprises:

Step 501: A first substrate and a second substrate are provided.

Step 502: The first substrate and the second substrate are disposed opposite to each other, and the device to be packaged and the first sealing structure are provided between the first substrate and the second substrate, and the first sealing structure is located at a peripheral region of the first substrate, a peripheral portion of at least one of the first substrate and the first substrate is provided with a sealing hole, a second sealing structure is formed in the sealing hole, and the first sealing structure is bonded to the second sealing structure.

According to the packaging method according to the embodiment of the present disclosure, the mechanical strength of the package structure formed thereof can be improved.

Optionally, in some embodiments, the first substrate and the second substrate may be disposed opposite to each other such that the device to be packaged is disposed between the first substrate and the second substrate. A sealing hole can be formed in a peripheral region of at least one of the first substrate and the second substrate. A first sealant can be applied between the first substrate and the second substrate, and the first sealant can enter the sealing hole under the action of capillary force. The first sealant can be cured to so that a first sealing structure is formed between the first substrate and the second substrate, and a second sealing structure is formed in the sealing hole, and the first sealing structure is bonded to the second sealing structure.

According to some embodiments of the present disclosure, a packaging method is also provided. The packaging method may comprise: providing a first substrate and a second substrate, a peripheral region of at least one of the first substrate and the second substrate being provided with sealing hole(s). The method further comprises: disposing the first substrate and the second substrate opposite to each other, and disposing a device to be packaged between the first substrate and the second substrate. The method further comprises: forming a first sealing structure between the first substrate and the second substrate and forming a second sealing structure in the sealing hole. The first sealing structure may be located at a peripheral region of the first substrate and disposed around the device to be packaged. The first sealing structure is bonded to the second sealing structure.

According to another embodiment of the present disclosure, a packaging method is also provided. The packaging method may comprise: providing a first substrate and a second substrate. The packaging method may further comprise: disposing the first substrate and the second substrate opposite to each other, and disposing a device to be packaged between the first substrate and the second substrate. The packaging method may further comprise: forming a sealing hole in a peripheral region of at least one of the first substrate and the second substrate. The packaging method may comprise: forming a first sealing structure between the first substrate and the second substrate and forming a second sealing structure in the sealing hole. The first sealing structure may be located at a peripheral region of the first substrate and disposed around the device to be packaged. The first sealing structure is bonded to the second sealing structure.

As previously mentioned, the first sealing structure may be integrally formed with the second sealing structure from a same material (e.g., UV glue).

Optionally, forming a sealing hole in a peripheral region of at least one of the first substrate and the second substrate comprises: forming uniformly arranged sealing holes in the peripheral region of the first substrate and the peripheral region of the second substrate, respectively. That is, in the peripheral region of the first substrate, the sealing holes may be formed to be uniformly arranged. Similarly, in the peripheral region of the second substrate, the sealing holes may also be formed to be uniformly arranged.

In some embodiments, a laser puncher is used to form the sealing hole(s) in the peripheral region of at least one of the first substrate and the second substrate.

Optionally, in some embodiments, the packaging method may further comprise: forming a support pillar on at least one of the first substrate and the second substrate. In this case, the first substrate and the second substrate are disposed opposite to each other such that the support pillar is located between the first substrate and the second substrate. That is, the support pillar is formed between the first substrate and the second substrate.

In some embodiments, the packaging method may further comprise: applying a second sealant on the peripheral region of the at least one of the first substrate and the second substrate; disposing the first substrate and the second substrate opposite to each other such that the second sealant (and the device to be packaged) is located between the first substrate and the second substrate; and curing the second sealant to form a third sealing structure between the first substrate and the second substrate.

In some embodiments, the first sealant is subjected to a curing treatment (for example, by irradiating ultraviolet rays (UV)) to form a first sealing structure between the first substrate and the second substrate, and form a second sealing structure in the sealed hole. Thereby, the first sealing structure is bonded to the second sealing structure. In some embodiments, the first sealing structure is located around the third sealing structure.

Optionally, the forming material of the first sealing structure may comprise UV glue. Optionally, the forming material of the third sealing structure may comprise frit paste. In some embodiments, the elasticity of the UV glue is set to be greater than the elasticity of the frit paste.

According to the packaging methods according to the embodiments of the present disclosure, the mechanical strength of the formed package structure can be improved.

Figure 6A:
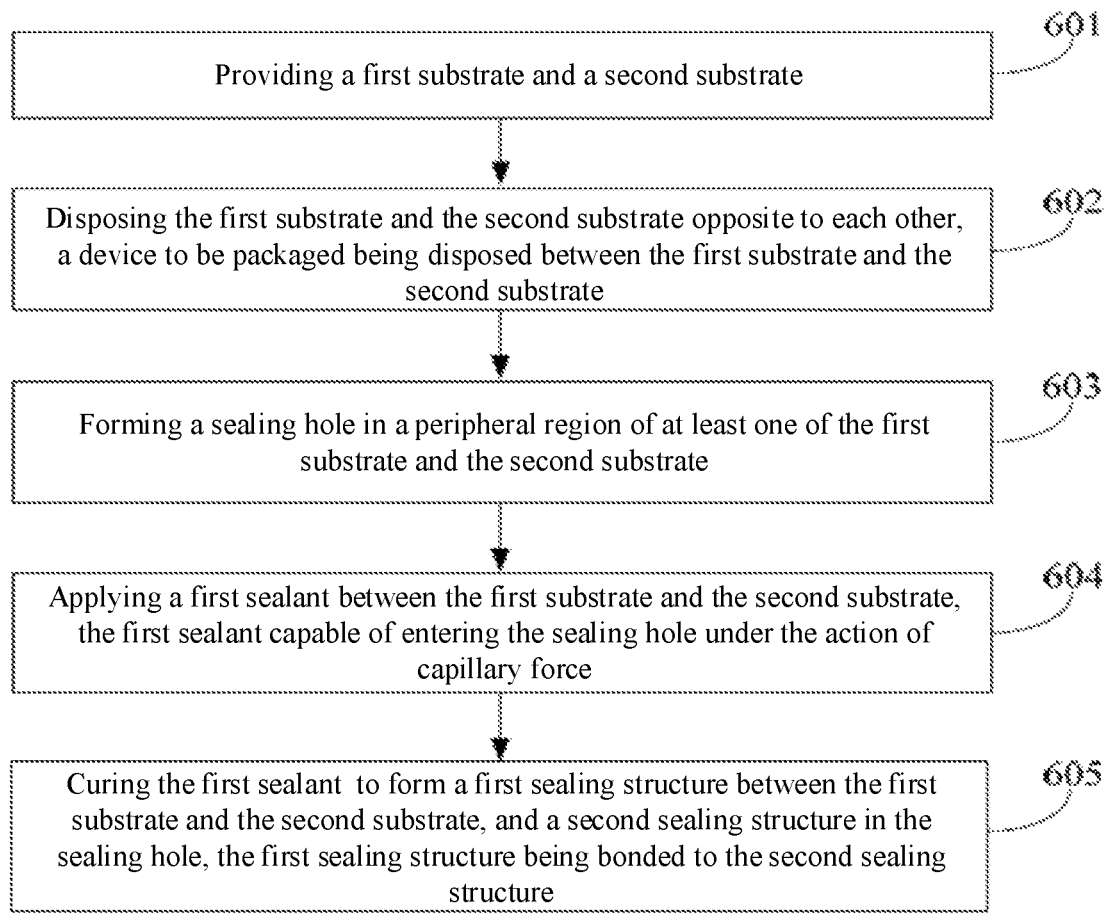
FIG. 6A is a flowchart of a packaging method according to another embodiment of the present disclosure.

Referring to FIG. 6A, a flowchart of a packaging method according to another embodiment of the present disclosure is illustrated. The packaging method can be used to form the package structure 02 shown in FIG. 2 or FIG. 3 to package the device to be packaged. The device to be packaged may be an OLED device. The package method will be described below by taking the package structure 02 shown in FIG. 3 as an example.

Referring to FIG. 6A, the method comprises: in step 601, a first substrate and a second substrate are provided. In some embodiments, each of the first substrate and the second substrate may be a transparent substrate. Specifically, the first substrate and the second substrate may be substrates made of light-transmitting and non-metallic material having a certain firmness such as glass, quartz, or transparent resins.

In step 602, the first substrate and the second substrate are disposed opposite to each other, and the device to be packaged is disposed between the first substrate and the second substrate.

In the embodiment of the present disclosure, the first substrate and the second substrate may be disposed opposite to each other, and the device to be packaged can be disposed between the first substrate and the second substrate. In some embodiments, the device to be packaged may be disposed on the first substrate, for example, on a non-peripheral region. The device to be packaged may be an OLED device.

In step 603, a sealing hole is formed in a peripheral region of at least one of the first substrate and the second substrate. Alternatively, a laser puncher may be used to form a sealing hole in a peripheral region of at least one of the first substrate and the second substrate. In some embodiments, the sealing holes on the first substrate are uniformly arranged in the peripheral region of the first substrate, and the sealing holes on the second substrate are uniformly arranged in the peripheral region of the second substrate.

Figure 7A:
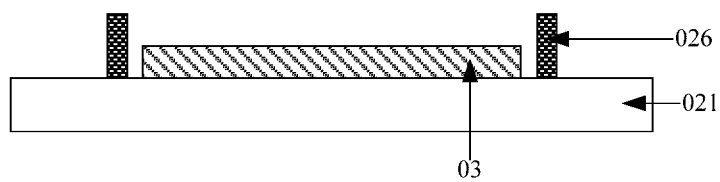
FIG. 7A is a schematic view of a structure after a support pillar is formed on a first substrate according to an embodiment of the present disclosure.
Figure 7B:
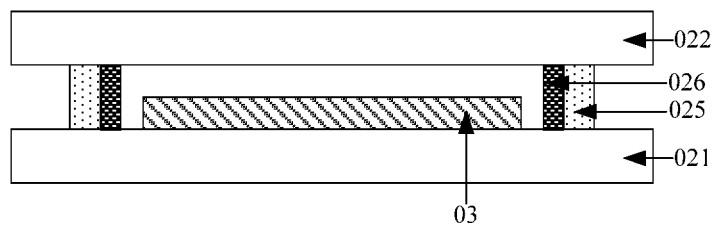
FIG. 7B is a schematic view of a structure after a second sealant is cured according to an embodiment of the present disclosure.
Figure 7C:
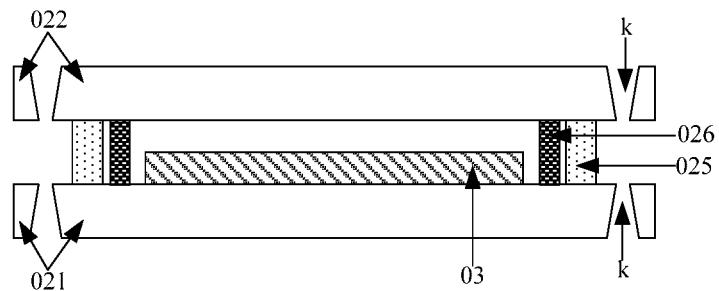
FIG. 7C is a schematic view of a structure after a sealing hole is formed in a peripheral region of a substrate according to an embodiment of the present disclosure.
Figure 7D:
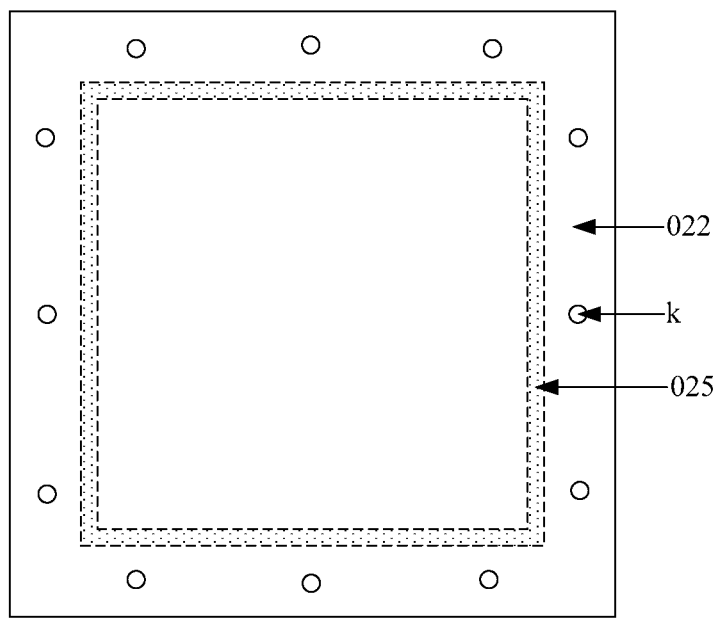
FIG. 7D is a plan view of FIG. 7C.

For example, referring to FIG. 7C, a schematic view of a structure after forming a sealing hole in a peripheral region of at least one of the first substrate and the second substrate is illustrated. Referring to FIG. 7C, the peripheral region of the first substrate 021 and the peripheral region of the second substrate 022 are both formed with sealing holes k. In some embodiments, the sealing holes k on the first substrate 021 correspond in a one-to-one manner with the sealing holes k on the second substrate 022. In some embodiments, there is an overlapping region of the orthographic projections of two corresponding sealing holes k (a sealing hole k on the first substrate 021 and a sealing hole on the second substrate 022) on the plane of the first substrate 021. In some embodiments, the longitudinal axes of the two corresponding sealing holes k can be set to be substantially collinear. The longitudinal axis of any of the sealing holes k may be disposed perpendicular to the face of the substrate on which the sealing hole k is located. FIG. 7D is a plan view of FIG. 7C. In conjunction with FIGS. 7C and 7D, the sealing holes k on the first substrate 021 are uniformly arranged in the peripheral region of the first substrate 021, and the sealing holes k on the second substrate 022 are uniformly arranged in the peripheral region of the second substrate.

Here, support posts 026 and a third seal structure 025 are also shown in FIG. 7C, which will be described later in detail.

In step 604, a first sealant is applied between the first substrate and the second substrate, and the first sealant is capable of entering the sealing hole under the action of capillary force. After forming a sealing hole in a peripheral region of at least one of the first substrate and the second substrate, a first sealant may be applied between the first substrate and the second substrate, the first sealant being capable of entering into the sealed hole under action of capillary force. The first sealant may be UV glue, the elasticity of which is typically greater than the frit glue.

Figure 7E:
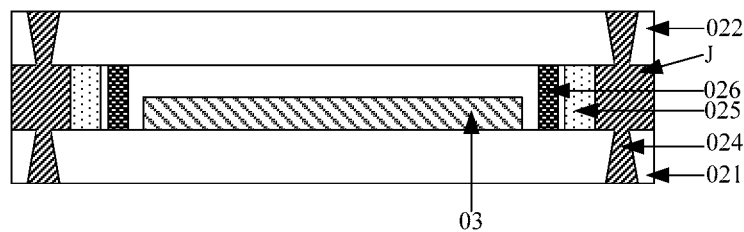
FIG. 7E is a schematic diagram of a structure after a first sealant is applied between a first substrate and a second substrate according to an embodiment of the present disclosure.

In some embodiments of the present disclosure, the sealing hole may be a circular hole having a diameter of between 0.5 mm and 2 mm. When the aperture of the sealing hole is small, it may facilitate the entering of the first sealing glue into the sealing hole under the action of capillary force. Optionally, the first sealant may be applied between the first substrate and the second substrate by a spray process. For example, referring to FIG. 7E, a schematic view of a structure after applying a first sealant between the first substrate and the second substrate is illustrated. Referring to FIG. 7E, after applying the first sealant J between the first substrate 021 and the second substrate 022, the first sealant J enters the seal hole under the action of the capillary force and fills the seal hole. The first sealant J in the seal hole and the first sealant J between the first substrate 021 and the second substrate 022 are combined into a whole (that is, can be formed integrally).

In step 605, the first sealant is subjected to a curing process to form a first sealing structure 023 between the first substrate and the second substrate, and a second sealing structure 024 in the sealing hole. As such, the first sealing structure and the second sealing structure can be joined together. In some embodiments, the first sealing structure is located around the third sealing structure, such as outside the third sealing structure.

Optionally, the first sealant may be UV glue. The first sealants as the UV glue between the first substrate and the second substrate and in the sealing hole may be irradiated with ultraviolet rays, so that the photo-initiator in the first sealant absorbs ultraviolet rays to generate active free radicals or cations which initiate a chemical reaction of the monomers in the first sealant to cure the first sealant. Refer to FIG. 3 for a schematic diagram of the structure after the first sealant is cured. Referring to FIG. 3, after the first sealant is cured, a first sealing structure 023 is formed between the first substrate 021 and the second substrate 022, a second sealing structure 024 is formed in the sealing hole, the first sealing structure 023 and the second sealing structure 024 are bonded, and the first sealing structure 023 is located outside the third sealing structure 025.

Figure 6B:
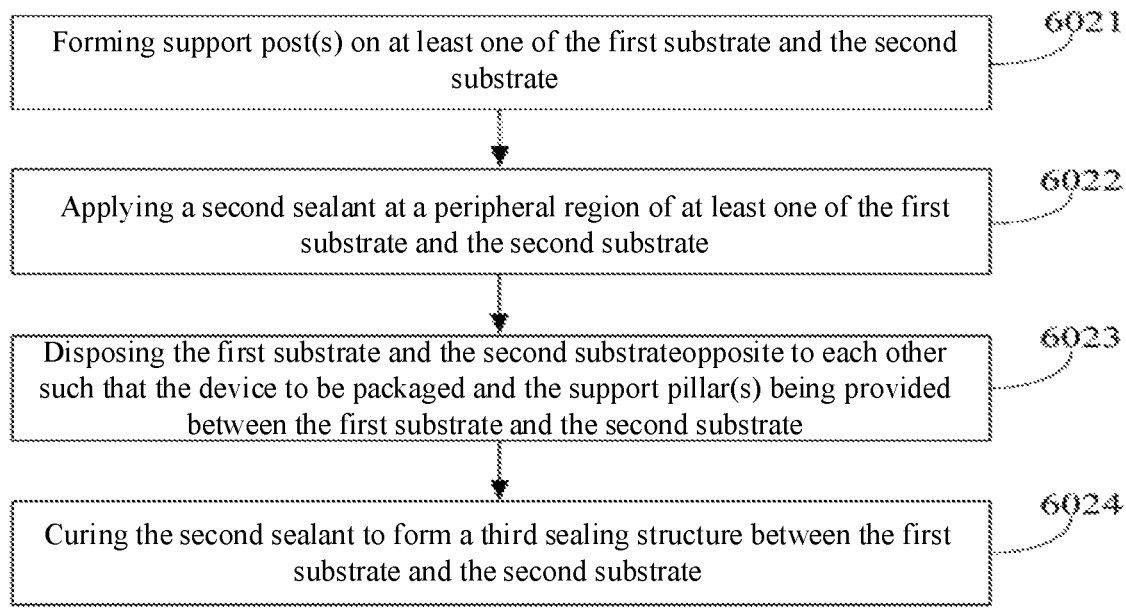
FIG. 6B is a flowchart of a method for disposing a first substrate and a second substrate opposite to each other according to an embodiment of the present disclosure.

FIG. 6B is a flow chart showing a partial packaging method according to another embodiment of the present disclosure. Description will be given below with reference to FIGS. 6A and 6B. The content described above with respect to FIG. 6A and other figures and embodiments can be likewise or adaptively applicable thereto.

At step 601, a first substrate and a second substrate are provided.

At step 6021, support post(s) is or are formed on at least one of the first substrate and the second substrate. The embodiments of the present disclosure are described by taking such a case as an example where the support pillars are formed on a first substrate. Referring to FIG. 7A, a schematic view of a structure after forming a support pillar on the first substrate is illustrated. Referring to FIG. 7A, a device to be packaged 03a is provided on a central region of the first substrate 021, and a support pillar 026 is formed on the peripheral region of the first substrate 021. The support posts 026 may be of a cylindrical structure.

In the embodiment of the present disclosure, the forming material of the support post 026 may be an organic resin material. Optionally, an organic resin layer may be formed on the first substrate 021 on which the device 03 to be packaged is located, using an organic resin material, and then the organic resin layer is processed by a patterning process to obtain a support pillar 026. In some embodiments, a one-time patterning process may comprise: photoresist coating, exposure, development, etching, and photoresist stripping. In some embodiments, processing the organic resin layer by a patterning process may comprise: forming a photoresist layer on the organic resin layer by a coating process; exposing the photoresist layer with a reticle to form a fully exposed region and a non-exposed region in the photoresist layer; then processing the exposed photoresist layer by a developing process to remove the photoresist in the fully exposed region, the photoresist in the non-exposed region being retained; then etching the region of the organic resin layer corresponding to the fully exposed region by an etching process; and then stripping the photoresist in the non-exposed region. Thereby, the support pillar 026 is obtained. It should be noted that the present embodiment of the present disclosure is described by taking the case where the support pillar 026 is formed by a patterning process as an example, but the disclosure is not limited thereto. In practical applications, the support post 026 may be formed at other positions, and then the support post 026 may be attached onto the peripheral region of the first substrate 021 to form the support post 026 on the first substrate 021, so as to avoid the influence on the packaged device 03 by the process of forming the support posts 026 on the substrate 021 with use of the patterning process.

At the sub-step 6022, a second sealant is applied at a peripheral region of at least one of the first substrate and the second substrate.

After the support pillar is formed on at least one of the first substrate and the second substrate, the second sealant may be applied at a peripheral region of at least one of the first substrate and the second substrate. The second sealant may be a frit glue. Optionally, the second sealant may be applied at a peripheral region of at least one of the first substrate and the second substrate by a spray process, a coating process, or the like.

In an example, the second sealant may be applied at the peripheral region of the first substrate by a spray process, the second sealant and the support post are located on the same surface of the first substrate, and the second sealant is located outside the support pillar.

In sub-step 6023, the first substrate and the second substrate are disposed opposite to each other such that the device to be packaged and the support pillar are provided between the first substrate and the second substrate.

After the second sealant is applied at the peripheral region of the at least one of the first substrate and the second substrate, the first substrate and the second substrate may be oppositely disposed so that the device to be packaged and the support pillars are located between the first substrate and the second substrate, and the second sealant is located between the first substrate and the second substrate. Specifically, the second substrate may be placed on the support pillars such that the first substrate and the second substrate are disposed opposite to each other, and the device to be packaged, the support post and the second sealant are located between the first substrate and the second substrate. The support pillars can support the second substrate to prevent the second substrate from contacting the device to be packaged to apply pressure to the device to be packaged, which otherwise may damage the device to be packaged.

At sub-step 6024, the second sealant is cured to form a third sealing structure 025 between the first substrate and the second substrate.

After the first substrate and the second substrate are disposed opposite to each other, the second sealant may be cured to form a third sealing structure, and the third sealing structure is located between the first substrate and the second substrate. In the embodiment of the present disclosure, the second sealant may be heated and baked to cure the second sealant. Alternatively, the second sealant may be allowed to stand for a preset period of time to cure the second sealant. For example, referring to FIG. 7B, a schematic diagram of a structure after the second sealant between the first substrate and the second substrate is cured according to an embodiment of the present disclosure is illustrated. Referring to FIG. 7B, after the second sealant is subjected to a curing process, the second sealant forms a third seal structure 025 which is located between the first substrate 021 and the second substrate 022, and outside the support post 026.

Thereafter, operations similar to steps 603-605 of FIG. 6A can be performed.

In step 603, sealing hole(s) is or are formed in a peripheral region of at least one of the first substrate and the second substrate.

Optionally, a laser puncher may be used to form the sealing hole(s) in a peripheral region of at least one of the first substrate and the second substrate. In some embodiments, the sealing holes on the first substrate are uniformly arranged in the peripheral region of the first substrate, and the sealing holes on the second substrate are uniformly arranged in the peripheral region of the second substrate.

For example, referring to FIG. 7C, a schematic view of a structure after forming the sealing holes in a peripheral region of at least one of the first substrate and the second substrate is illustrated. Referring to FIG. 7C, the peripheral region of the first substrate 021 and the peripheral region of the second substrate 022 are both formed with sealing holes k. The sealing holes k on the first substrate 021 correspond in a one-to-one manner with the sealing holes k on the second substrate 022. There is overlapping region of the orthographic projections of two corresponding sealing holes k on the plane of the first substrate 021. The longitudinal axes of the two corresponding sealing holes k are collinear. In some embodiments, the longitudinal axis of any of the sealing holes k is perpendicular to the face of the substrate on which the sealing hole k is located. FIG. 7D is a plan view of FIG. 7C. In conjunction with FIGS. 7C and 7D, the sealing holes k on the first substrate 021 are uniformly arranged in the peripheral region of the first substrate 021, and the sealing holes k on the second substrate 022 are uniformly arranged in the peripheral region of the first substrate.

In step 604, a first sealant is applied between the first substrate and the second substrate, and the first sealant can enter the sealing hole under the action of capillary force.

After forming the sealing holes in a peripheral region of at least one of the first substrate and the second substrate, a first sealant may be applied between the first substrate and the second substrate, the first sealant being capable of entering the sealed holes under the action of capillary force. The first sealant may be a UV glue, which is typically more elastic than the frit glue. In some embodiments of the present disclosure, the sealing hole may be a circular hole having a diameter of between 0.5 mm and 2 mm. Since the sealing hole has a small aperture, it is convenient for the first sealant to enter the sealing hole under the action of capillary force. Optionally, the first sealant may be applied between the first substrate and the second substrate by a spray process. For example, referring to FIG. 7E, a schematic view of a structure after applying the first sealant between the first substrate and the second substrate is illustrated. Referring to FIG. 7E, after the first sealant J is applied between the first substrate 021 and the second substrate 022, the first sealant J enters the sealing holes under the action of capillary force, and fills the sealing holes, and the first sealant J in the sealing holes are combined into a whole with the first sealant J between the first substrate 021 and the second substrate 022.

In step 605, the first sealant is cured to form a first sealing structure between the first substrate and the second substrate, and a second sealing structure in the sealing hole. The first sealing structure is bonded to the second sealing structure.

After applying the first sealant between the first substrate and the second substrate, the first sealant may be subjected to a curing process to cure the first sealant, and the first sealant between the first substrate and the second substrate forms the first sealing structure, the first sealant in the sealing hole forms the second sealing structure. The first sealing structure is bonded to the second sealing structure. The first sealing structure is located around the third sealing structure.

Optionally, the first sealant may be a UV glue, and the first sealant between the first substrate and the second substrate and the first sealant in the seal hole may be irradiated with ultraviolet rays so that the photo-initiator in the first sealant absorbs ultraviolet rays to generate active radicals or cations, which initiates a chemical reaction of the monomers in the first sealant, thereby curing the first sealant to be cured. Refer to FIG. 3 for a schematic diagram of the structure after the first sealant is cured. Referring to FIG. 3, after the first sealant is cured, a first sealing structure 023 is formed between the first substrate 021 and the second substrate 022, and a second sealing structure 024 is formed in the sealing hole. The first sealing structure 023 is bonded to the second sealing structure 024. The first sealing structure 023 is located outside the third sealing structure 025.

According to the packaging methods according to the embodiments of the present disclosure, the mechanical strength of the formed package structure can be improved.

According to the embodiments of the present disclosure, there is also provided a display device that may comprise the package structure according to any embodiment of the present disclosure (e.g., the embodiment described in connection with FIG. 2 or FIG. 3, etc.), and a device to be packaged (e.g., OLED device, etc.).

The term "and/or" (if any) as used in the present disclosure is only used to describe an association relationship between the associated objects, indicating that there may be three relationships; for example, the expression A and/or B may indicate there cases that A only, A and B, and B only. In addition, the symbol "/" in this article (if any) generally indicates that the contextual objects is in an "or" relationship.

Those skilled in the art will readily appreciate that the boundaries between the operations (or steps) described in the above embodiments are merely illustrative. Multiple operations may be combined into a single operation, a single operation may be distributed among additional operations, and operations may be performed at least partially overlapping in time. Moreover, alternative embodiments may comprise multiple instances of a particular operation, and the operational sequence may be varied in other various embodiments. However, other modifications, changes, and replacements are possible too. Accordingly, the specification and drawings are to be regarded as illustrative, not restrictive.

While the specific embodiments of the present disclosure have been described in detail by way of example, those skilled in the art can readily understand that various embodiments disclosed above are merely for purpose of describing, and not for limiting the scope of the present disclosure. Those embodiments disclosed herein can be freely combined as appropriate without departing from the spirit and scope of the disclosure. It will be understood by those skilled in the art that various modifications or changes can be made in the embodiments without departing from the scope and spirit of the disclosure. The scope of the disclosure shall be defined by the appended claims.

What is claimed is:

1. A package structure comprising:
   a first substrate provided with at least one first sealing hole penetrating the first substrate in a peripheral portion thereof;
   a second substrate disposed opposite to the first substrate, and provided with at least one second sealing hole, which penetrates the second substrate and faces the at least one first sealing hole respectively, in a peripheral portion thereof;
   a first sealing structure disposed between the first substrate and the second substrate and located at a peripheral region of the first substrate; and
   a second sealing structure having a first portion disposed in the first sealing hole and a second portion disposed in the second sealing hole,
   wherein the first sealing structure and the second sealing structure are integral with the first sealing structure positioned between the first and second portions of the second sealing structure,
   wherein the at least one first sealing hole has a diameter at a side thereof adjacent to the second substrate smaller than a diameter at a side thereof distal to the second substrate, and
   where the at least one second sealing hole has a diameter at a side thereof adjacent to the first substrate smaller than a diameter at a side thereof distal to the first substrate.

2. The package structure according to claim 1, wherein the at least one first sealing hole comprises a plurality of first sealing holes, and the at least one second sealing hole comprises a plurality of second sealing holes facing the plurality of first sealing holes, respectively, and
   wherein the plurality of the first sealing holes are uniformly arranged in the peripheral region of the first substrate, and the plurality of the second sealing holes are uniformly arranged in the peripheral region of the second substrate.

3. The package structure according to claim 2, wherein the first sealing holes on the first substrate correspond to the second sealing holes on the second substrate in a one-to-one manner, and the orthographic projections of the first sealing holes of the first substrate and the second sealing holes of the second substrate, which correspond to each other, on a plane where the first substrate is located have overlapping regions.

4. The package structure according to claim 3, wherein any sealing hole of the first and second sealing holes has a longitudinal cross-section of a rectangular or trapezoidal shape along a central axis thereof, and has a lateral cross-section of a rectangular, circular or triangular shape, the lateral cross-section being perpendicular to the longitudinal cross-section, and
   the central axes of the first sealing holes of the first substrate and the central axes of the corresponding second sealing holes of the second substrate are substantially collinear.

5. The package structure according to claim 1, wherein the at least one first or the at least one second sealing hole is a circular hole, and has a diameter in a range from 0.5 mm to 2 mm.

6. The package structure according to claim 1, further comprising:
   a third sealing structure disposed between the first substrate and the second substrate and located at the peripheral region of the first substrate, the first sealing structure being located around the third sealing structure,
   wherein the first substrate, the second substrate, and the third sealing structure form a sealed cavity for encapsulating therein a device to be packaged.

7. The package structure according to claim 1, further comprising:
   a support pillar disposed between the first substrate and the second substrate,
   wherein the first substrate, the second substrate, the support pillar and the first sealing structure form a sealed cavity for encapsulating therein a device to be packaged.

8. The package structure according to claim 6, wherein the first sealing structure and the second sealing structure are integrally formed of ultraviolet (UV) glue, and the third sealing structure is formed of frit glue, wherein an elasticity of the UV glue is set to be greater than that of the frit glue.

9. A display device comprising:
   a package structure according to claim 1; and
   an organic light emitting diode (OLED) device sealed in the package structure.

10. A packaging method comprising:
providing a first substrate with at least one first sealing hole penetrating the first substrate in a peripheral portion thereof;
providing a second substrate disposed opposite to the first substrate and with at least one second sealing hole in a peripheral portion thereof, the at least one second sealing hole penetrating the second substrate and facing the at least one first sealing hole respectively;
disposing the first substrate and the second substrate opposite to each other, and disposing between the first substrate and the second substrate a device to be packaged;
forming a first sealing structure between the first substrate and the second substrate at a peripheral region of the first substrate;
forming a second sealing structure having a first portion disposed in the first sealing hole and a second portion disposed in the second sealing hole,
wherein the first sealing structure and the second sealing structure are integral with the first sealing structure positioned between the first and second portions of the second sealing structure,
wherein the at least one first sealing hole has a diameter at a side thereof adjacent to the second substrate smaller than a diameter at a side thereof distal to the second substrate, and
where the at least one second sealing hole has a diameter at a side thereof adjacent to the first substrate smaller than a diameter at a side thereof distal to the first substrate.

11. The method according to claim 10, wherein forming a first sealing structure and forming a second sealing structure comprise:
applying a first sealant between the first substrate and the second substrate so that the first sealant enters the at least one first sealing holes and at least one second sealing holes under an action of capillary force; and
curing the first sealant to form the first sealant structure and the second sealing structure.

12. The method according to claim 10, wherein:
the first and second sealing holes are formed to be uniformly arranged in the peripheral region of the first substrate and a peripheral region of the second substrate.

13. The method according to claim 10, wherein
the first and second sealing holes are formed in the peripheral regions of the first substrate and the second substrate by using a laser puncher.

14. The method according to claim 10, further comprising:
applying a second sealant at the peripheral regions of the first substrate and the second substrate
the second sealant and the device to be packaged being disposed between the first substrate and the second substrate; and
curing the second sealant to form a third sealing structure between the first substrate and the second substrate, wherein the first sealing structure is located around the third sealing structure.

15. The method of claim 14 further comprising:
forming a support pillar on at least one of the first substrate and the second substrate,
wherein the first substrate and the second substrate are disposed opposite to each other such that the support pillar is between the first substrate and the second substrate.

16. The method according to claim 14, wherein the first sealing structure is formed from ultraviolet (UV) glue, and the third sealing structure is formed from frit glue, wherein an elasticity of the UV glue is set to be greater than that of the frit glue.

* * * * *